United States Patent
Mallecot et al.

(10) Patent No.: US 6,208,794 B1
(45) Date of Patent: Mar. 27, 2001

(54) MULTI-SECTION ELECTRO-OPTICAL MONOLITHIC COMPONENT

(75) Inventors: Franck Mallecot, Montrouge; Christine Chaumont, Villejuif; Arnaud Leroy; Antonina Plais, both of Paris; Hisao Nakajima, Bagneux, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/411,981

(22) Filed: Oct. 4, 1999

(30) Foreign Application Priority Data

Oct. 5, 1998 (FR) .................................................. 98 12456

(51) Int. Cl.$^7$ ...................................................... G02B 6/10
(52) U.S. Cl. ............................................ 385/131; 385/130
(58) Field of Search ..................................... 385/129–132, 385/141, 143, 14, 50, 17; 372/50, 45, 96; 257/17

(56) References Cited

U.S. PATENT DOCUMENTS

| 4,712,855 | * | 12/1987 | Tolksdorf et al. | .................... 385/141 |
| 5,031,188 | * | 7/1991 | Koch et al. | ............................. 372/50 |
| 5,652,812 | * | 7/1997 | Gurib et al. | ............................ 385/14 |
| 5,808,314 | * | 9/1998 | Nakajima et al. | ...................... 257/17 |

FOREIGN PATENT DOCUMENTS

| 44 10 948 A1 | 10/1995 | (DE) . |
| 0 278 408 A2 | 8/1988 | (EP) . |
| 0 531 215 A1 | 3/1993 | (EP) . |
| 0 645 654 A1 | 3/1995 | (EP) . |
| 0 847 113 A1 | 6/1998 | (EP) . |

* cited by examiner

Primary Examiner—Frank G. Font
Assistant Examiner—Sang H. Nguyen
(74) Attorney, Agent, or Firm—Sughrue, Mion, Zinn, Macpeak & Seas, PLLC

(57) ABSTRACT

A semiconductor electro-optical monolithic component includes at least first and second sections (20, 30) each having respectively a first wave guide (21) and a second wave guide (31) transmitting light, the wave guides being etched in the form of strips and confined between an upper cladding layer (11) doped with carriers of a first type and a lower layer (10A, 10B) doped with carriers of a second type, a third section (40) being disposed between the first and second sections (20, 30) and having a third guide not transmitting light, the third guide being disposed so as to couple the first guide (21) to the said second guide (31). An absorbent layer (70), having a photoluminescence wavelength at least equal to the smallest wavelength of the waves propagating in the first and second wave guides (21, 31), is placed in the said lower layer (10A, 10B) doped with carriers of the second type; the said lower layer (10A, 10B) having an index lower than that of the absorbent layer (70) and that of the said second and third guides (31).

10 Claims, 2 Drawing Sheets

MULTI-SECTION ELECTRO-OPTICAL MONOLITHIC COMPONENT

BACKGROUND OF THE INVENTION

The present invention relates to a semiconductor electro-optical monolithic component comprising at least two sections each having a wave guide etched in the form of a strip and buried in a cladding layer.

For this type of buried strip multi-section electro-optical component, it is important to have a high electrical isolation between each section in order to avoid interactions between these during the operation of the component. The invention relates more particularly to any electro-optical component, comprising at least one transmitting element and one receiving element which are integrated, for which it is sought to allow a simultaneous transmission/reception operation, without any interaction between the transmitter and the receiver.

FIG. 1 depicts a diagram in longitudinal cross-section of a conventional in-line transmitter/receiver component, denoted IL TRD ("In-line Transmitter Receiver Device"), obtained by monolithic integration of a laser 30 and a detector 20 on one and the same substrate 10. The laser 30 transmits a signal towards an optical fibre 50 for example, while the detector 20 receives a signal coming from this same optical fibre. The transmitting wavelength of the laser 30 is less than the receiving wavelength of the detector 20. For example, the transmitting wavelength is equal to 1.3 $\mu$m while the receiving wavelength is equal to 1.55 $\mu$m. In this case, given that the transmitting wavelength is less than the receiving wavelength, and that the laser 30 is situated close to the detector 20, the laser can cause optical interference on the detector. This is because the laser also transmits, in the direction of the detector, light at 1.3 $\mu$m which dazzles the said detector. In order to avoid this dazzling of the detector, the component has a third section, disposed between the laser 30 and the detector 20, forming an optical isolator 40. This optical isolator makes it possible to absorb the light transmitted at 1.3 $\mu$m in the direction of the detector, so that the latter can detect the optical signal at 1.55 $\mu$m coming from the optical fibre without being interfered with by the laser.

The substrate 10, or lower layer, can for example be of n-doped InP. The wave guides respectively 21 of the detector 20 and 31 of the laser 30 and of the optical isolator 40 are etched in the form of strips and buried in a strongly doped cladding layer 11. The wave guides are of so-called BRS ("Buried Ridge Structure") type. The cladding material 11 is $p^+$-doped when the substrate is n-doped. Of course, this type of strip is only an example. Other types of strip can be suitable. The n and p dopings of the different layers can also be reversed.

There are many variants of composition and dimensions of the wave guides. In the example of FIG. 1, the wave guide 21 of the detector 20 is for example implemented in ternary material, while the wave guides 31 of the laser and of the optical isolator 40 are implemented with one and the same quantum-well structure.

Moreover, metal electrodes 22, 32, 42 and 13 are formed on the different sections and on the underneath of the component, so as to allow it to operate.

On account of the presence of conductive layers (11), the component also has electrical isolation areas I, or resistive areas, between the different sections 20, 30, 40 in order to avoid any electrical interference of one section with regard to another during operation of the component.

This type of in-line transmitter/receiver, having a central part 40 allowing absorption of all the light flux transmitted at 1.3 $\mu$m towards the detector, works very well for all light which is guided in the wave guide strips 31.

However, not all the light transmitted is completely guided. This is because there is also spontaneous light which is transmitted in the whole volume of the component. In addition, part of the stimulated light can also be diffracted in the component as a result of the presence of defects in the wave guide 31.

The curves in FIG. 2 reveal the penalties noted on the detector sensitivity, in dB, for different operating indices. Curve A depicts a receiving reference when the laser is off, curve B depicts a receiving reference when the laser is on continuously and curve C depicts the simultaneous modulation of the laser and the detector. A 4.5 dB penalty between curve B and curve C, when the laser and the detector are modulated simultaneously, is noted. This penalty is mainly optical. It is caused by the non-guided light transmitted at 1.3 $\mu$m, in all directions, which interferes with the detector at 1.55 $\mu$m. This stray light attacks the detector mainly through the lower part (the substrate) of the component, that is to say through the n-doped lower layer 10 situated under the guiding layer strips 21, 31.

This optical interference coming from the substrate 10 is depicted very schematically in FIG. 1. A metal electrode 13, disposed at the substrate/air interface, can act as an optical reflector. Part of the spontaneous light transmitted in the volume of the component can therefore be reflected by the electrode 13 and return to couple with the detector 20 from underneath. This is why the stray light, which is coupled via the substrate of the component, has been depicted, in FIG. 1, by a wave 60 reflected on the metal electrode 13 of the substrate. Of course, the interference of the detector 20 by the non-guided light is in reality much more complex than a single reflection. This is because part of the stray light can also undergo multiple reflections in the lower layer 10. Another part of this stray light can also dazzle the detector at a grazing incidence for example.

Some techniques have already been envisaged to combat the 4.5 dB penalty noted in the example given in FIG. 2, which occurs at the time of simultaneous modulation of the laser and the detector. The techniques envisaged are electronic techniques. They consist for example in taking part of the laser modulation signal, and then in subtracting it at reception. The use of these electronic processing techniques has demonstrated a 2 dB reduction in the penalty. However, they require the devising, manufacture and development of special electronics for this particular type of transmitter/receiver component, with the result that they considerably increase the cost of this component. However, it is sought to manufacture this type of component on a large scale and therefore reduce its production cost as much as possible. Consequently, these electronic processing techniques cannot be used for the mass production of such a component.

Moreover, an in-line transmitter/receiver is intended to be installed at the premises of subscribers and it must be able to operate between around 0 and 70° C. without any temperature regulation. However, the reliability of these electronic techniques has not been demonstrated over this temperature range and it is not proved that they can automatically adjust as a function of the temperature.

SUMMARY OF THE INVENTION

One aim of the present invention therefore consists in implementing an inexpensive electro-optical monolithic component having a detector and a parasitic element for the detector, such as a laser, the transmitting wavelength being less than the receiving wavelength, in which the 4.5 dB interference of the detector by the parasitic element (according to the example in FIG. 2), which occurs at the time of their simultaneous modulation, is considerably reduced.

The present invention relates more particularly to a semiconductor electro-optical monolithic component comprising at least first and second sections each having respectively a first wave guide and a second wave guide transmitting light, the said wave guides being etched in the form of strips and confined between an upper cladding layer doped with carriers of a first type and a lower layer doped with carriers of a second type, a third section being disposed between the said first and second sections and having a third guide not emitting light, the said third guide being disposed so as to couple the said first guide to the said second guide, characterised in that an absorbent layer, having a photoluminescence wavelength at least equal to the smallest wavelength of the waves propagating in the said first and second wave guides, is placed in the said lower layer doped with carriers of the second type; the said lower layer having an index lower than that of the absorbent layer and-that of the said second and third guides.

The invention exploits the fact that, if a stray wave originating from the second guide and reaching the absorbent layer is not totally absorbed thereby, it undergoes a partial reflection due to the index gradient between the absorbent layer and the upper layer. The reflected part of this wave is then directed (at least partially) towards the second or the third guide which in its turn reflects it towards the absorbent layer.

As this phenomenon occurs over a distance corresponding to the length of the second and third guides, an absorption distributed over this length is obtained.

The consequence of this is that the thickness of the absorbent layer can be reduced compared with the case where the same light energy would have to be absorbed by passing through the absorbent layer a single time (or a limited number of times). The fact of requiring-only a small thickness implies a reduced manufacturing time and especially a lower risk of having defects appear in the absorbent layer.

Thus, the absorbent layer has a thickness less than 2 $\mu$m and greater than 0.2 $\mu$m.

Advantageously, the thickness is between 0.2 and 1 Moreover, the greater the absorption length, the more efficient the absorption.

It was possible to establish experimentally that a good efficiency was obtained if the length of the third guide was greater than around 100 $\mu$m.

This will be the case in particular for transmitter/receivers which are provided with a third isolating section whose length is typically of the order of 300 $\mu$m.

According to another characteristic of the invention, the absorbent layer is doped with carriers of the second type.

According to another characteristic of the invention, the absorbent layer is disposed at a distance from the wave guides such that it does not interact with the wave guide transmitting the non-guided light. This distance is preferably greater than 1 $\mu$m.

According to another characteristic of the invention, this component constitutes an in-line transmitter/receiver whose transmitting wavelength is less than the receiving wavelength.

According to yet another characteristic of the invention, the carriers of the first type are p-type carriers, and the carriers of the second type are n-type carriers.

BRIEF DESCRIPTION OF THE DRAWINGS

Other features and advantages of the invention will emerge from a reading of the description given by way of an illustrative example and produced with reference to the accompanying figures which depict.

DETAILED DESCRIPTION OF THE INVENTION

Figure 3:
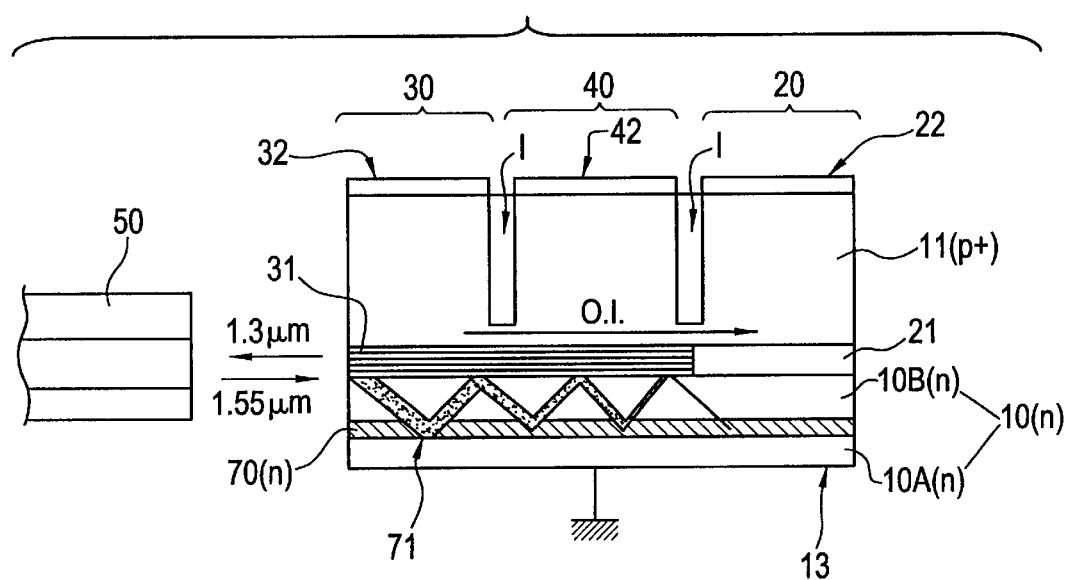

FIG. 3 shows schematically an embodiment of a component according to the invention. It shows schematically more particularly an in-line transmitter/receiver. But the invention is not limited solely to in-line transmitter/receivers; it applies to any integrated opto-electronic component for which optical crosstalk exists, that is to say to any component comprising a parasitic element and an element capable of detecting for which the transmitted and received wavelengths are compatible.

Figure 1:
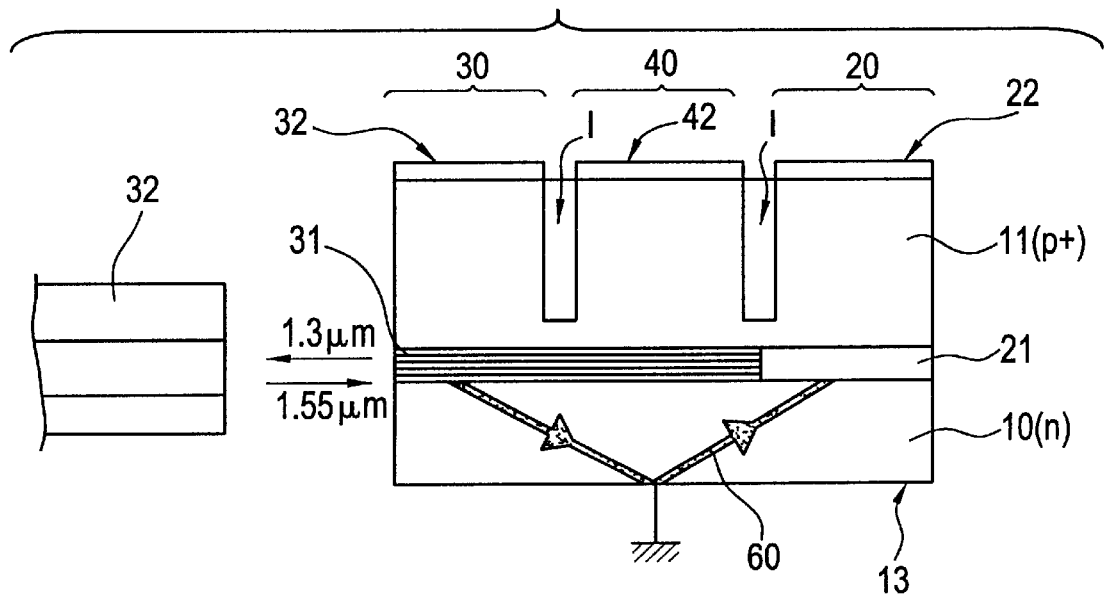
in FIG. 1, already described, a diagram of a conventional in-line transmitter/receiver, in FIG. 2, already described, curves revealing the operating penalties at the time of a simultaneous modulation of the transmitter and the receiver of the component of FIG. 1, in FIG. 3 a diagram of an example of a transmitter/receiver component according to the invention.

In this example, the same references are used to designate the same elements as in the conventional transmitter/receiver shown schematically in FIG. 1. The laser 30 transmits at a wavelength smaller than the receiving wavelength of the detector 20. The transmitting wavelength is for example equal to 1.3 $\mu$m while the receiving wavelength is equal to 1.55 $\mu$m.

Figure 2:
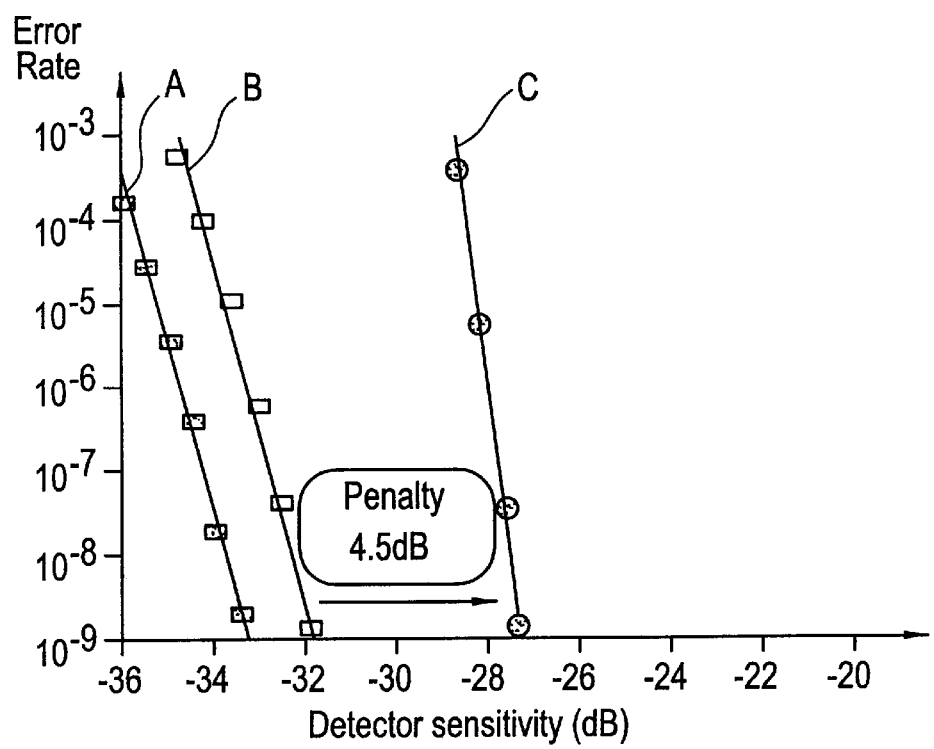

The spontaneous light transmitted by the laser 30 and not guided by the wave guide 31 is transmitted in the whole volume of the component. Moreover, part of the stimulated light is diffracted in the component on account of the presence of defects in the wave guide 31. All these stray light waves transmitted at 1.3 $\mu$m by the laser 30, in all directions, interfere with and dazzle the detector which can no longer correctly detect the wavelength at 1.55 $\mu$m. This interference is shown schematically simply by the arrow O.I. (Optical Interference) in FIG. 3. It comes mainly from the lower part of the transmitter/receiver component, that is to say through the layers situated underneath the wave guides 21, 31. This interference leads to a 4.5 dB penalty (according to the example cited in FIG. 2) at the time of a simultaneous modulation of the laser 30 and the detector 20.

In order to eliminate this non-guided stray light transmitted at 1.3 $\mu$m, the transmitter/receiver according to the invention comprises an absorbent layer 70 which is placed in the n-doped lower layer of the component.

This absorbent layer 70 is implemented preferably in ternary material. It is deposited for example on the n-doped InP substrate 10A and is covered, for example, by an n-doped InP buffer layer 10B. The substrate 10A and the buffer layer 10B form two parts of the n-doped lower layer 10 of the component. The absorbent layer 70 is furthermore doped with the same type of carriers as the substrate 10A and the buffer layer 10B in order to avoid the creation of parasitic junctions in the lower part of the component. In the example, the absorbent layer 70 is therefore n-doped. Of course, this is only an example; the component according to the invention can very well have layers whose doping is reversed. Thus, it can have an n-doped cladding layer and a p-doped lower layer having a p-doped absorbent layer.

By virtue of the absorbent layer 70, it has been shown experimentally that the penalty which exists when the laser and the detector are modulated simultaneously is reduced by 3 dB. The remaining penalty of 1.5 dB is in fact due mainly to the guiding effects of the wave guides.

The absorbent layer 70 absorbs the non-guided stray light transmitted at 1.3 pm. But it must not absorb the guided mode of the laser 30. Consequently, it is necessary to place the absorbent layer 70 at a distance from the wave guides 21, 31 such that it does not interact significantly with the guided mode of the laser. This distance is preferably greater than 1 μm. In an example embodiment, it is placed at a distance of 3 μm below the wave guides 21 and 31.

The light wave 71 absorbed by the absorbent layer 70 between the laser 30 and the detector 20 is depicted very schematically in FIG. 3. In fact, on account of the differences in refractive index between the wave guide 31 of the laser, the buffer layer 10B and the absorbent layer 70, the non-guided spontaneous light undergoes multiple reflections, and is absorbed by the absorbent layer 70 as it propagates towards the detector 20. But, of course, the transmitted light is not only reflected between these layers; it can also undergo other reflections in all the lower layers of the component, that is to say in the buffer layer 10B and/or the absorbent layer 70 and/or the substrate 10A and/or the metallized electrode 13. In fact, propagation of the non-guided stray light takes place, in all directions, in all the layers of the lower part of the component, situated under the wave guides 21 and 31. Thus, the stray light is absorbed as it propagates, so that it becomes very weak, perhaps even non-existent, before reaching the detector 20. The detector 20 is therefore no longer interfered with by the stray waves transmitted at 1.3 μm.

What is claimed is:

1. A semiconductor electro-optical monolithic component comprising:

first and second sections (20, 30) having respectively a first wave guide (21) and a second wave guide (31) transmitting light, the wave guides being etched in the form of strips and confined between an upper cladding layer (11) doped with carriers of a first type and a lower layer (10A, 10B) doped with carriers of a second type;

a third section (40) disposed between the first and second sections (20, 30) and having a third guide not emitting light, the third guide being disposed so as to couple the first guide (21) to the second guide (31); and an absorbent layer (70), having a photoluminescence wavelength at least equal to the smallest wavelength of the waves propagating in the first and second wave guides (21, 31), the absorbent layer (70) placed in the lower layer (10A, 10B) doped with carriers of the second type, the lower layer (10A, 10B) having a refractive index lower than that of the absorbent layer (70) and that of the second and third wave guides (31).

2. A monolithic component according to claim 1, characterised in that the absorbent layer has a thickness less than 2 μm and greater than 0.2 μm.

3. A component according to claim 2, characterised in that the thickness of the absorbent layer (70) is between 0.2 μm and 1 μm.

4. A component according to claim 1, characterised in that the length of the third wave guide is greater than 100 μm.

5. A component according to claim 4, characterised in that the distance between the absorbent layer (70) and the wave guides (21, 31) is greater than 1 μm.

6. A component according to claim 1, characterised in that the absorbent layer (70) is doped with carriers of the second type.

7. A component according to claim 1, characterised in that the absorbent layer (70) is implemented in a ternary material.

8. A component according to claim 1, wherein the absorbent layer (70) is disposed a distance below the wave guides (21, 31), the distance being determined so that the absorbent layer does not significantly interact with guided light transmitted via the first wave guide (31).

9. A component according to claim 1, wherein the component constitutes an in-line transmitter/receiver whose transmitting wavelength is less than its receiving wavelength.

10. A component according to claim 1, characterised in that the carriers of the first type are p-type carriers, and in that the carriers of the second type are n-type carriers.

* * * * *